Dec. 29, 1964 W. J. SCOTT 3,163,835
VOLTAGE-TUNEABLE MICROWAVE REACTIVE ELEMENT
UTILIZING SEMICONDUCTOR MATERIAL
Filed Aug. 17, 1962
Fig. 1.
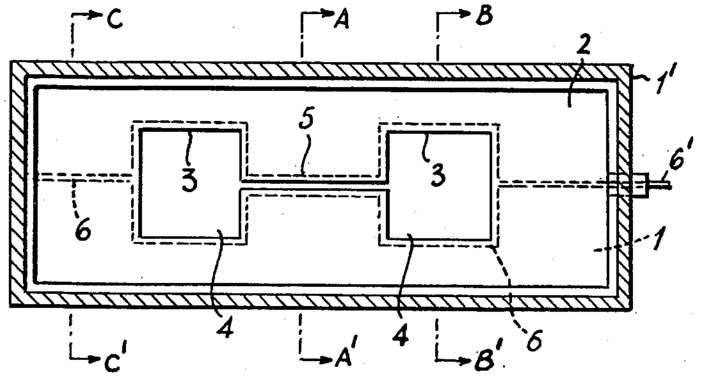
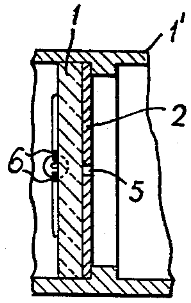
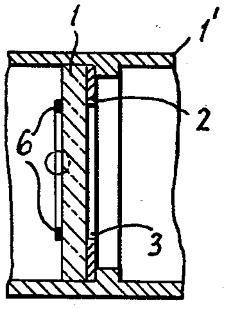
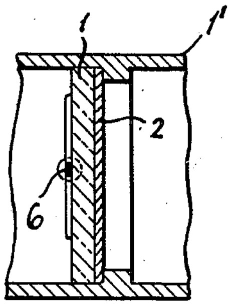
Fig. 2. Fig. 3. Fig. 4.
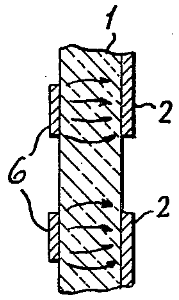
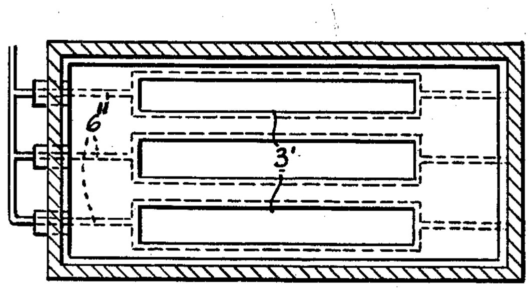
Fig. 5. Fig. 6.

3,163,835
Patented Dec. 29, 1964

3,163,835

VOLTAGE-TUNEABLE MICROWAVE REACTIVE ELEMENT UTILIZING SEMICONDUCTOR MATERIAL

William Joseph Scott, Rugby, England, assignor to Associated Electrical Industries Limited, London, England, a British company Filed Aug. 17, 1962, Ser. No. 217,750
Claims priority, application Great Britain, Sept. 11, 1961, 32,527/61
5 Claims. (Cl. 333—83)

This invention relates to reactive elements suitable for operation at microwave frequencies, and in particular to elements providing at least one resonant slot or aperture, the resonant frequency of which is adjustable.

Heretofore, reactive elements suitable for insertion in a section of waveguide, or other microwave device, have consisted of a sheet of conducting material in which an opening or slot is provided; the opening or slot may be filled with a vitreous material such as glass and its configuration is such that it presents desired values of inductive and capacitive reactance at a certain resonant frequency of the microwave energy. It is known to provide a reactive element with a mechanical arrangement whereby the configuration of the opening may be altered from outside of the waveguide. In this way the element is tuned to resonate at different frequencies. At least part of the mechanical arrangement is contained within the section of waveguide and difficulty is encountered in providing accurately machined, relatively moving parts which have to be assembled in an enclosed space.

An object of the present invention is to provide a tuneable reactive element which has no moving parts and which avoids the above-mentioned difficulties.

In accordance with the present invention, a microwave reactive element comprises a wafer of semiconductor material having a layer of conducting material in ohmic contact with one face thereof, said layer having at least one opening formed therein and an electrode, forming an injecting contact with the face of the wafer remote from the layer, located in the vicinity of the periphery of the aperture. By applying a control voltage between the electrode and the electrically conductive material, current is caused to flow through the thickness of the semiconductor material. The effect of the current depends upon the magnitude and polarity of the applied control voltage, i.e. whether a forward or backward bias is applied to the junction provided by the injecting contact. When zero bias is applied to the junction, the conductivity of the body is the so-called intrinsic conductivity. By causing the junction to be biased in the carrier injecting direction, the injected carriers diffuse into the body in the region of the aperture to a distance largely determined by their lifetimes and the conductivity of this region increases considerably. If the bias is arranged in the non-injecting direction, the electrons and holes which are continuously created (in pairs) by thermal motion of the crystal lattice of the semiconductor material can be virtually all removed so that the conductivity of the body becomes insignificant. Although more than one opening and electrode in injecting contact with the wafer may be provided, it is preferable for one opening and one electrode to be employed.

An injecting contact is one through which current carriers may be injected into the semiconductor material and may comprise either a PN or other rectifying contact.

Preferably, the electrode makes an injecting contact with at least part of the projection of the periphery of the opening on to the face of the wafer remote from the layer of conducting material. The layer of conducting material is conveniently in the form of a coating applied to the surface of the wafer.

In order that the invention may be more readily understood, it will now be described, by way of example, with reference to the accompanying drawing in which:

FIG. 1 is a front view of a tuneable reactive element in accordance with an embodiment of the invention mounted in a section of waveguide, FIGS. 2 to 4 are sections on the lines AA', BB' and CC', respectively, of FIG. 1, FIG. 5 is an enlarged portion of FIG. 2, and FIG. 6 shows a further embodiment of the invention.

A wafer of low conductivity intrinsic semiconductor material having a generally rectangular form is indicated at 1. The breadth and height of the wafer are slightly smaller than the corresponding dimensions of a section of waveguide 1' with which it is associated, so that the wafer may be mounted in a plane transverse to the axis of the waveguide. A layer 2 of conducting material is arranged on one face of the wafer and in ohmic contact therewith. The layer may be in the form of a conducting coating on the wafer, or alternatively it may comprise a metallic foil attached to the wafer. An opening of any suitable form is located centrally in the layer 2 and the opening 3 shown in the drawing is of typical iris configuration and consists of two openings 4 interconnected by a slot 5. An electrode 6 which makes an injecting contact with the wafer is formed on the face of the wafer which is remote from the layer 2, in the vicinity of the rim of the opening. The electrode preferably extends along the projection of the periphery of the opening normal to that surface and also to at least one edge of the wafer where a terminal 6' is provided by which electrical connection can easily be made to the electrode. It will be obvious that it is necessary for the terminal 6' to extend in insulating relation through the wall of the waveguide.

Referring particularly to FIG. 5, when a control voltage is applied between the electrode 6 and the wall of the waveguide which is in electrical contact with the conducting layer 2, and the voltage is such that current flows through the section of the wafer to the conducting layer on the opposite face, as indicated by the arrows in the figure, current carriers are created between the electrode 6 and the conducting layer 2 and the carriers diffuse into the central region for distances depending upon their life times. The regions through which the current flow takes place is changed from a substantially insulating to a conductive region, the amount by which the impedance of the region changes depending upon the magnitude of the applied control voltage, except when the radio frequency voltage exceeds a limiting magnitude. The change in impedance of the semiconductor wafer in the vicinity of the aperture alters the capacitance of the opening in the conducting layer and enables the device to be tuned to a different frequency.

The change in resistance of the wafer will also change the amount of damping which the device provides, but this may be advantageous in certain applications.

In order to increase the sensitivity of the device, the semiconductor wafer may be treated so that it is of thinner cross-section in the vicinity of the slot 5.

FIG. 6 illustrates a further embodiment of the invention, in which three similar apertures 3' are formed in a single wafer of semiconductor material. Each aperture is of generally rectangular form and has an electrode 6'' in injecting contact with the wafer in the vicinity of the periphery of each aperture.

What I claim is:

1. In combination with a waveguide, a microwave reactive element across the width of the waveguide, said reactive element comprising a wafer of semiconductor material having first and second substantially parallel faces, a covering of electrically conductive material in ohmic contact with and covering part of said first face with said covering defining at least one uncovered aperture, and an electrode in injecting contact with said second face substantially at the projection onto said second face of the periphery of said aperture in a direction normal to the planes of said faces.

2. In combination with a waveguide, a microwave reactive element across the width of the waveguide, said reactive element comprising a rectangular wafer of semiconductor material having first and second substantially parallel faces, a layer of electrically conductive material in ohmic contact with and covering part of said first face with said layer defining at least one uncovered aperture, and an electrode in injecting contact with said second face substantially at the projection onto said second face of the periphery of said aperture in a direction normal to the planes of said faces.

3. In combination with a waveguide, a microwave reactive element across the width of the waveguide, said reactive element comprising a rectangular wafer of semiconductor material having first and second substantially parallel faces, a coating of electrically conductive material in ohmic contact with and covering part of said first face with said coating defining an uncoated aperture in the form of two generally rectangular apertures interconnected by a rectangular slot, and an electrode in injecting contact with said second face substantially at the projection onto said second face of the periphery of said aperture in a direction normal to the planes of said faces.

4. In combination with a waveguide, a microwave reactive element across the width of the waveguide, said reactive element comprising a rectangular wafer of semiconductor material having first and second substantially parallel faces, a covering of electrically conductive material in ohmic contact with and covering part of said first face, with said covering defining an uncovered aperture in the form of two generally rectangular apertures interconnected by a rectangular slot, and an electrode in injecting contact with said second face along substantially all of the projection onto said second face of the periphery of said aperture in a direction normal to the planes of said faces.

5. The combination of a section of waveguide, a microwave reactive element comprising a body of semiconductor material having first and second substantially parallel faces, a covering of electrically conductive material in ohmic contact with and covering part of said first face with said covering defining at least one uncovered aperture, and an electrode in injecting contact with said second face substantially at the projection onto said second face of the periphery of said aperture in a direction normal to the planes of said faces, with said element mounted within the waveguide with the planes of said faces transverse to the longitudinal axis of the waveguide and said covering electrically connected to the wall of said waveguide, and a terminal electrically connected to said electrode and extending in insulating relation through the wall of said waveguide.

References Cited by the Examiner

UNITED STATES PATENTS

| | | | |
|---|---|---|---|
| 2,748,351 | 5/56 | Varnerin | 333—98 |
| 2,936,425 | 5/60 | Shockley | 307—88.5 |
| 3,034,079 | 5/62 | Uhlir | 333—98 |
| 3,094,671 | 6/63 | Garrett et al. | 307—88.5 |

HERMAN KARL SAALBACH, *Primary Examiner.*